(12) United States Patent
Cheng et al.

(10) Patent No.: US 9,935,180 B2
(45) Date of Patent: Apr. 3, 2018

(54) FIN CUT FOR TAPER DEVICE

(71) Applicants: International Business Machines Corporation, Armonk, NY (US); GlobalFoundries, Inc., Grand Cayman (KY)

(72) Inventors: Kangguo Cheng, Schenectady, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/482,040

(22) Filed: Apr. 7, 2017

(65) Prior Publication Data

US 2017/0243956 A1    Aug. 24, 2017

Related U.S. Application Data

(63) Continuation of application No. 15/073,065, filed on Mar. 17, 2016, now Pat. No. 9,647,093, which is a continuation of application No. 14/841,951, filed on Sep. 1, 2015, now Pat. No. 9,659,785.

(51) Int. Cl.
| | |
|---|---|
| *H01L 29/06* | (2006.01) |
| *H01L 29/66* | (2006.01) |
| *H01L 21/02* | (2006.01) |
| *H01L 21/306* | (2006.01) |

(Continued)

(52) U.S. Cl.
CPC .. *H01L 29/66795* (2013.01); *H01L 21/02233* (2013.01); *H01L 21/3065* (2013.01); *H01L 21/3086* (2013.01); *H01L 21/30604* (2013.01); *H01L 21/02255* (2013.01)

(58) Field of Classification Search
CPC .............. H01L 21/31; H01L 21/30604; H01L 21/3065; H01L 21/324; H01L 29/0657; H01L 29/16
See application file for complete search history.

(56) References Cited

U.S. PATENT DOCUMENTS

| | | | | |
|---|---|---|---|---|
| 8,603,893 B1 * | 12/2013 | Wei | ................ | H01L 21/76229 257/E21.546 |
| 8,617,996 B1 * | 12/2013 | Chi | ................ | H01L 21/30604 257/E21.377 |

(Continued)

*Primary Examiner* — Mark Tornow
(74) *Attorney, Agent, or Firm* — Cantor Colburn LLP; Vazken Alexanian

(57) ABSTRACT

A method of making a semiconductor device includes patterning a fin in a substrate; performing a first etch to remove a portion of the fin to cut the fin into a first cut fin and a second cut fin, the first cut fin having a first and second fin end and the second cut fin having a first and second fin ends; forming an oxide layer along an endwall of the first fin end and an endwall of the second fin end of the first cut fin, and an endwall of the first fin end and an endwall of the second fin end of the second cut fin; disposing a liner onto the oxide layer disposed onto the endwall of the first fin end of the first cut fin to form a bilayer liner; and performing a second etch to remove a portion of the second cut fin.

1 Claim, 15 Drawing Sheets

(51) Int. Cl.
    *H01L 21/308*  (2006.01)
    *H01L 21/3065* (2006.01)

(56)  References Cited

U.S. PATENT DOCUMENTS

| | | | | |
|---|---|---|---|---|
| 8,658,536 | B1* | 2/2014 | Choi | H01L 21/308 |
| | | | | 257/E21.409 |
| 9,064,932 | B1* | 6/2015 | Pham | H01L 21/823437 |
| 2007/0132053 | A1* | 6/2007 | King | H01L 21/84 |
| | | | | 257/499 |
| 2013/0065326 | A1* | 3/2013 | Sudo | H01L 27/228 |
| | | | | 438/3 |
| 2014/0264572 | A1* | 9/2014 | Kim | H01L 21/3083 |
| | | | | 257/331 |
| 2015/0129983 | A1 | 5/2015 | Yu et al. | |
| 2015/0145065 | A1 | 5/2015 | Kanakasabapathy et al. | |
| 2015/0318215 | A1 | 11/2015 | Taylor, Jr. et al. | |
| 2015/0318398 | A1* | 11/2015 | Xie | H01L 29/78 |
| | | | | 257/288 |
| 2015/0340238 | A1 | 11/2015 | Xie et al. | |
| 2016/0254369 | A1 | 9/2016 | Yi et al. | |

* cited by examiner

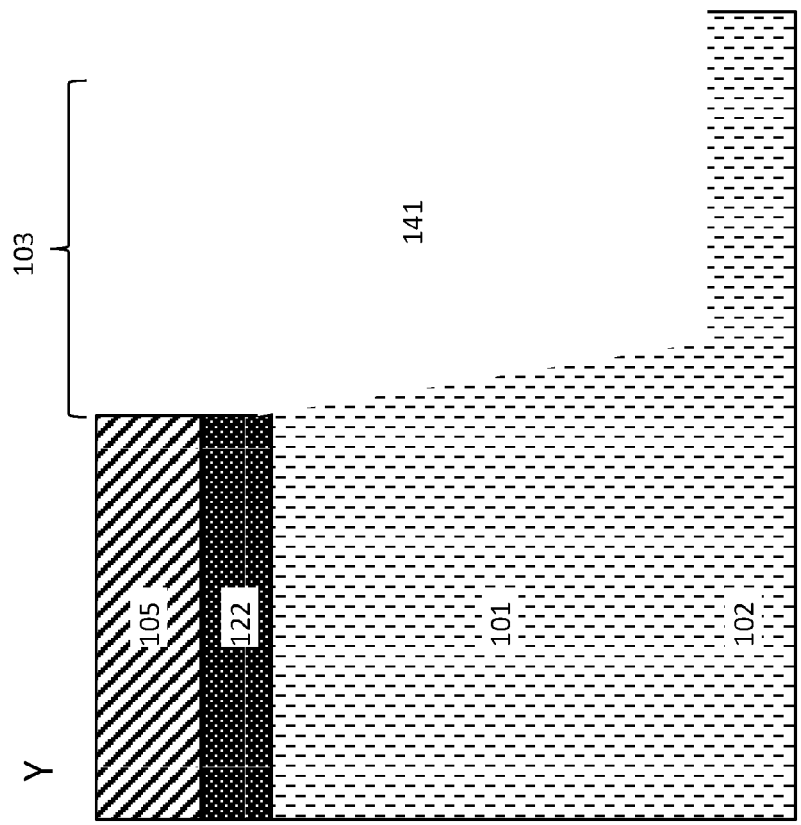
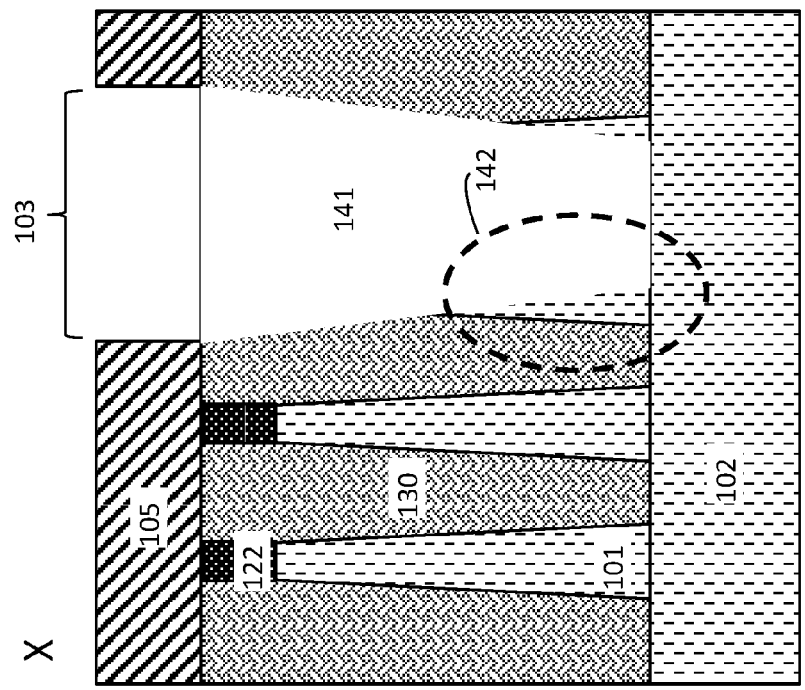
FIG. 1C
FIG. 1D

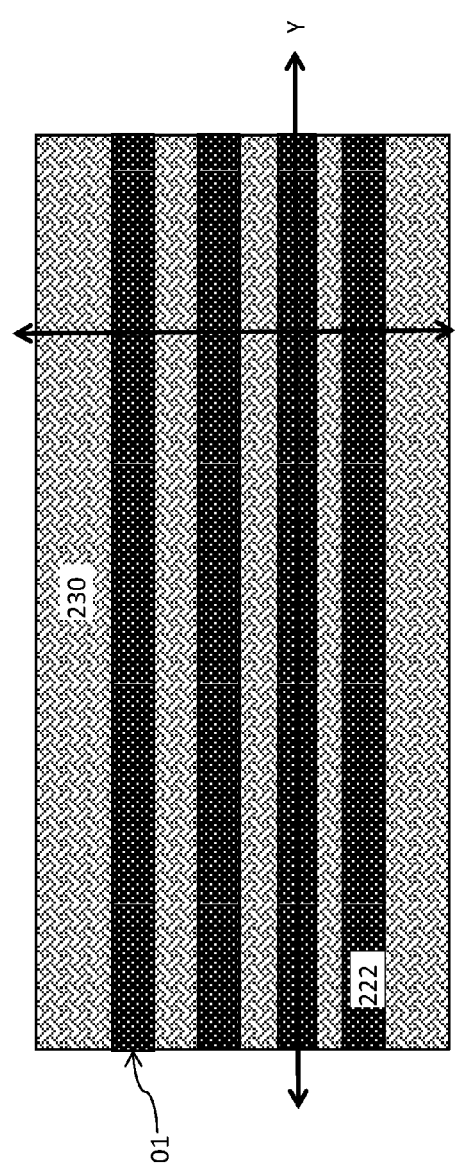
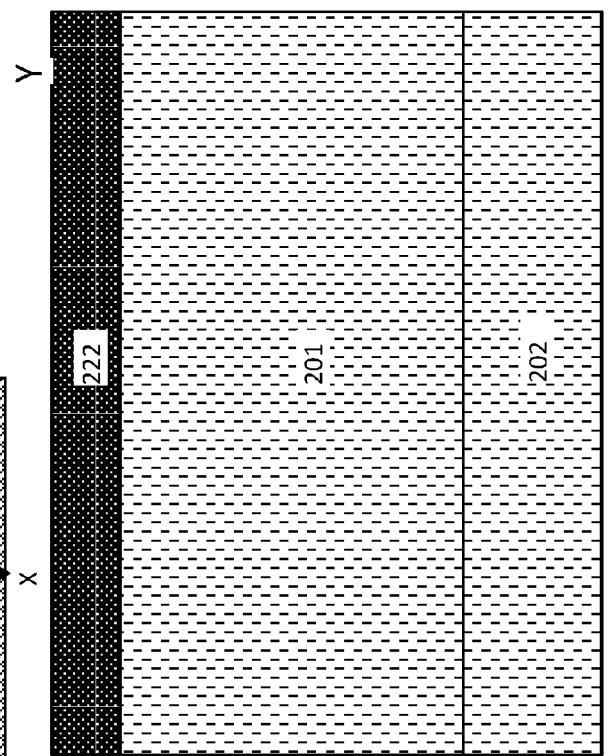
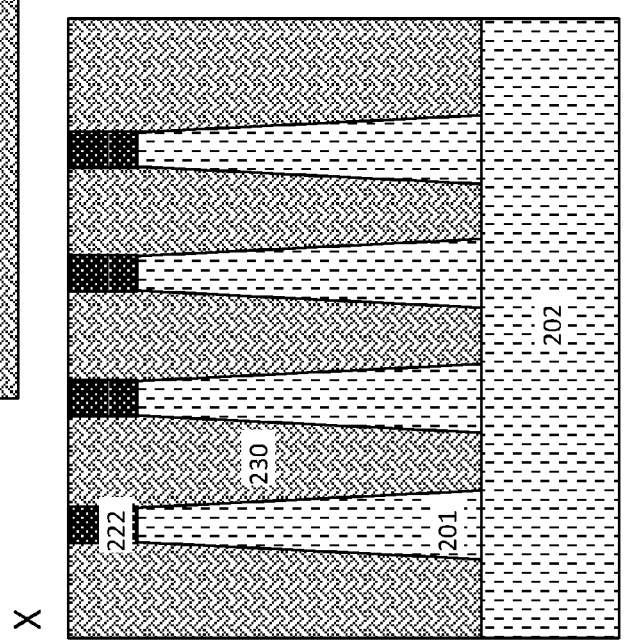
FIG. 2A
FIG. 2C
FIG. 2B

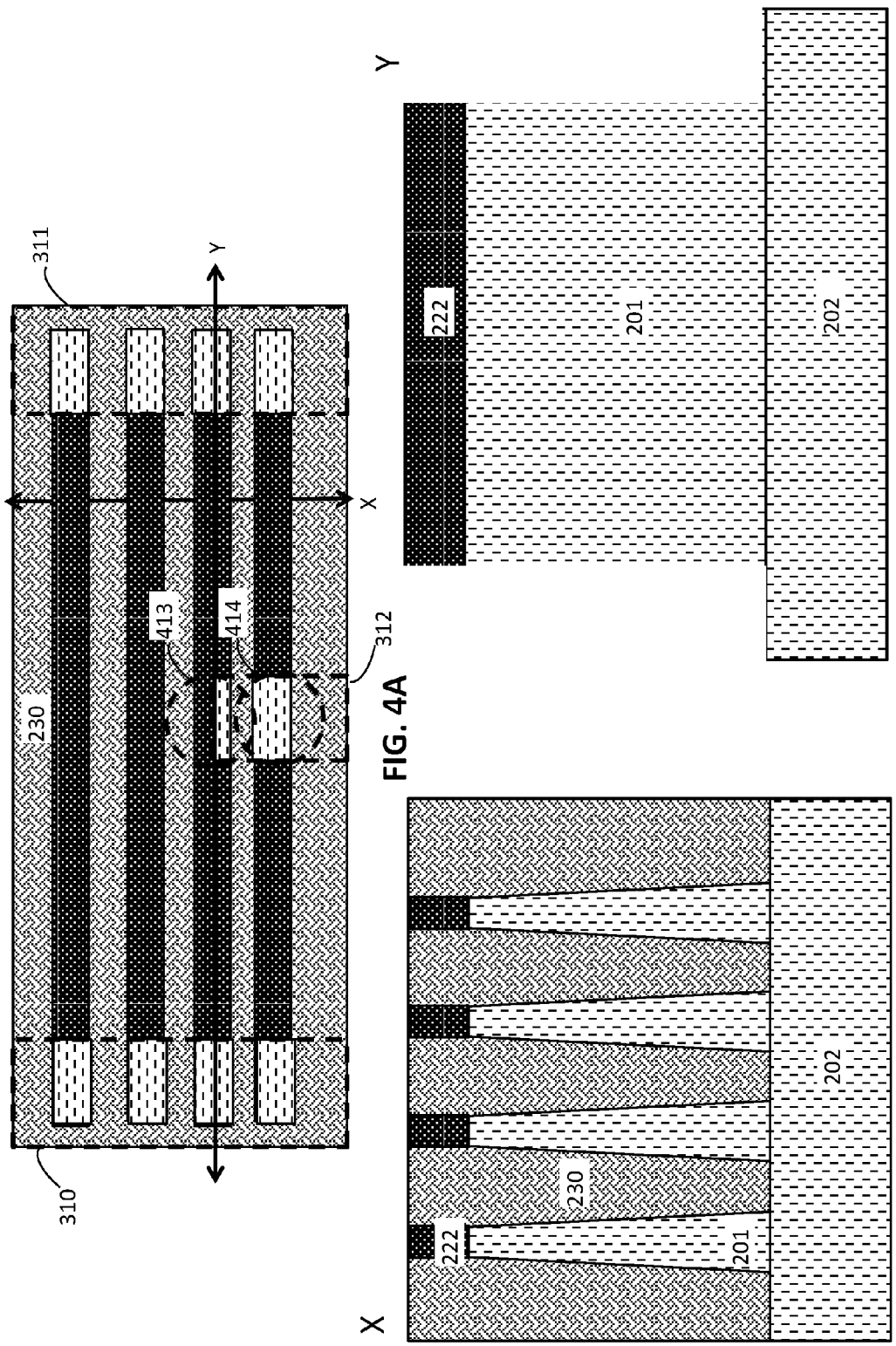

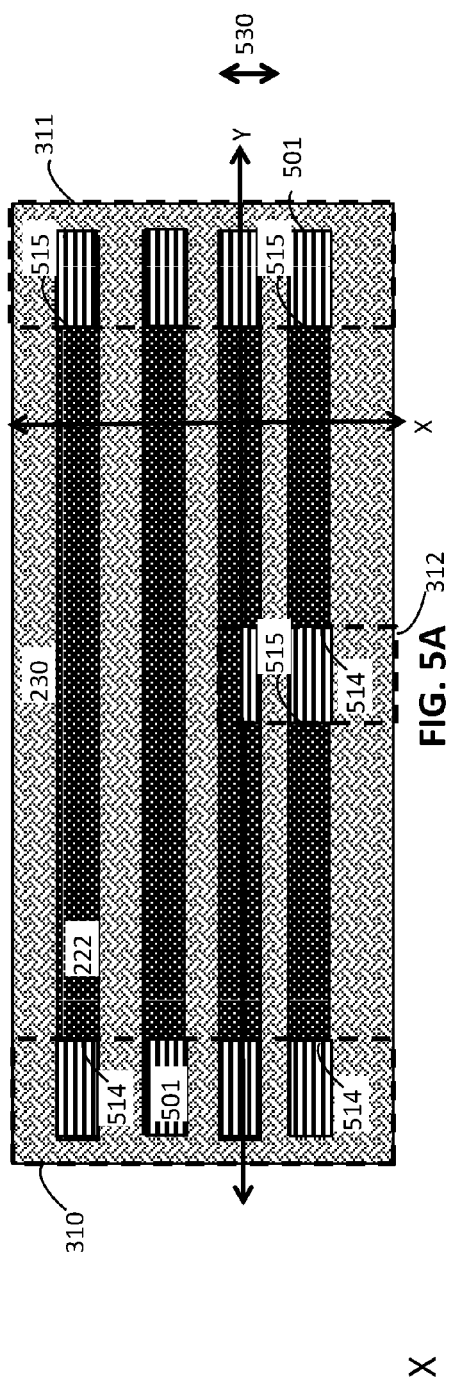
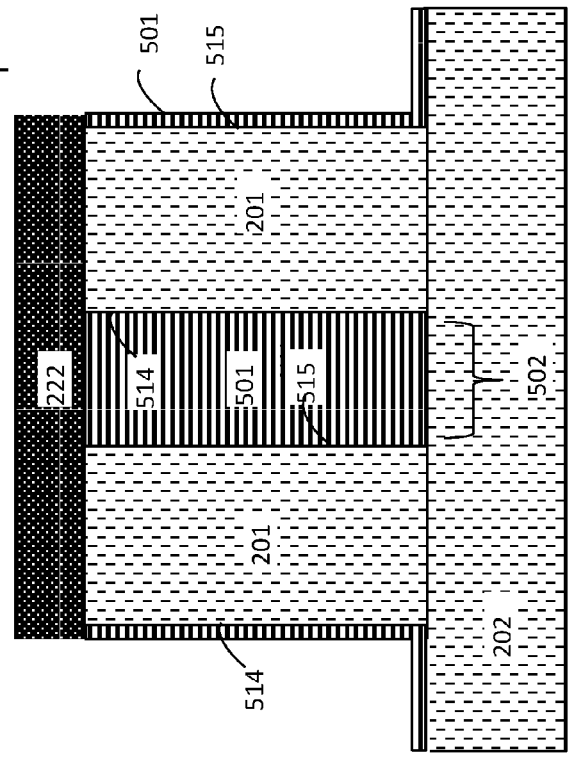
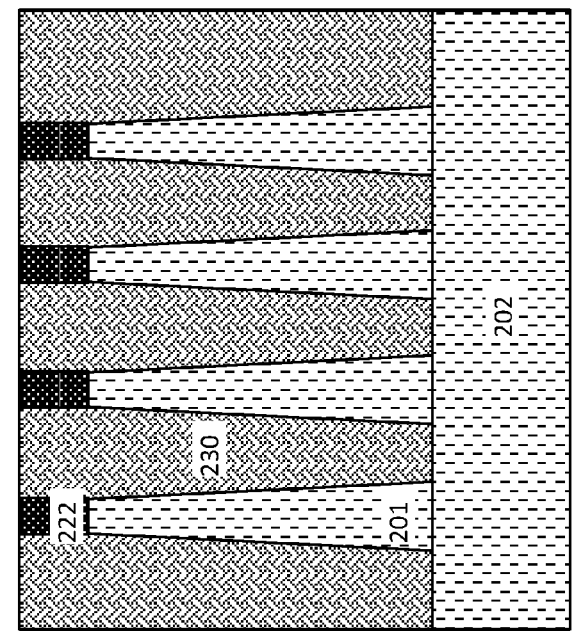
FIG. 5A
FIG. 5C
FIG. 5B

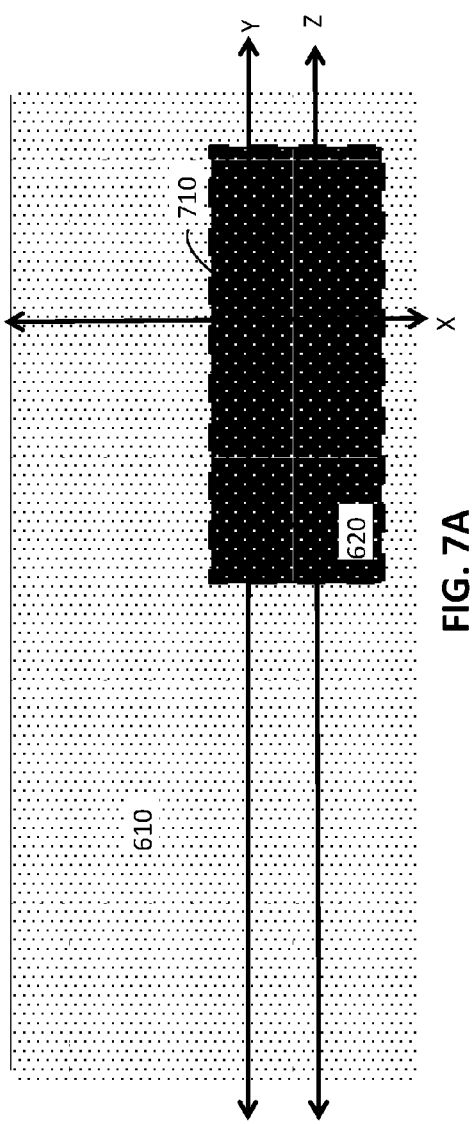
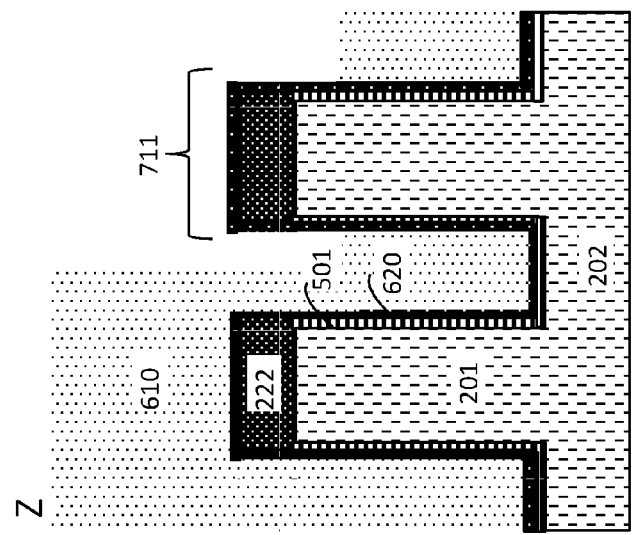
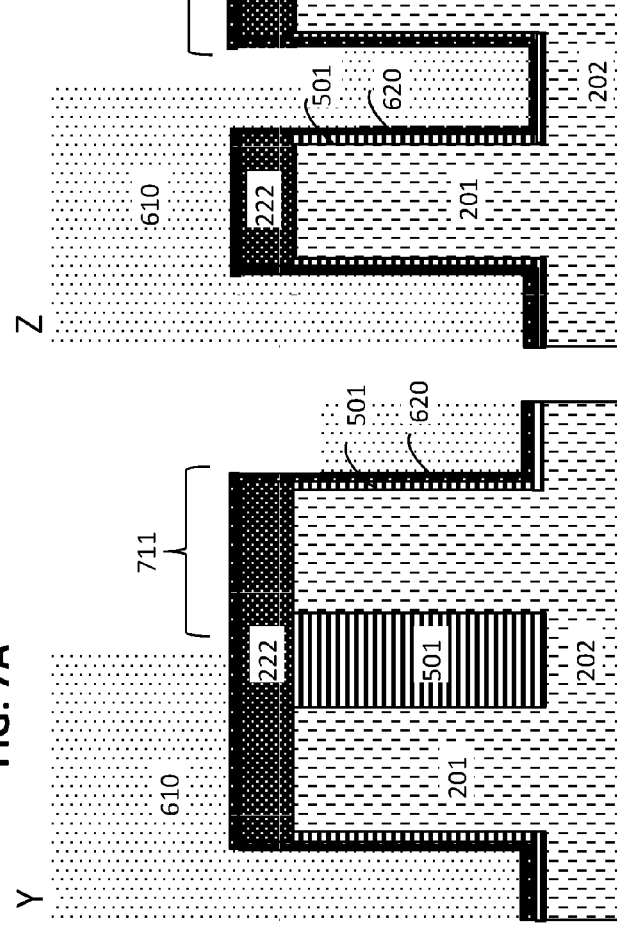
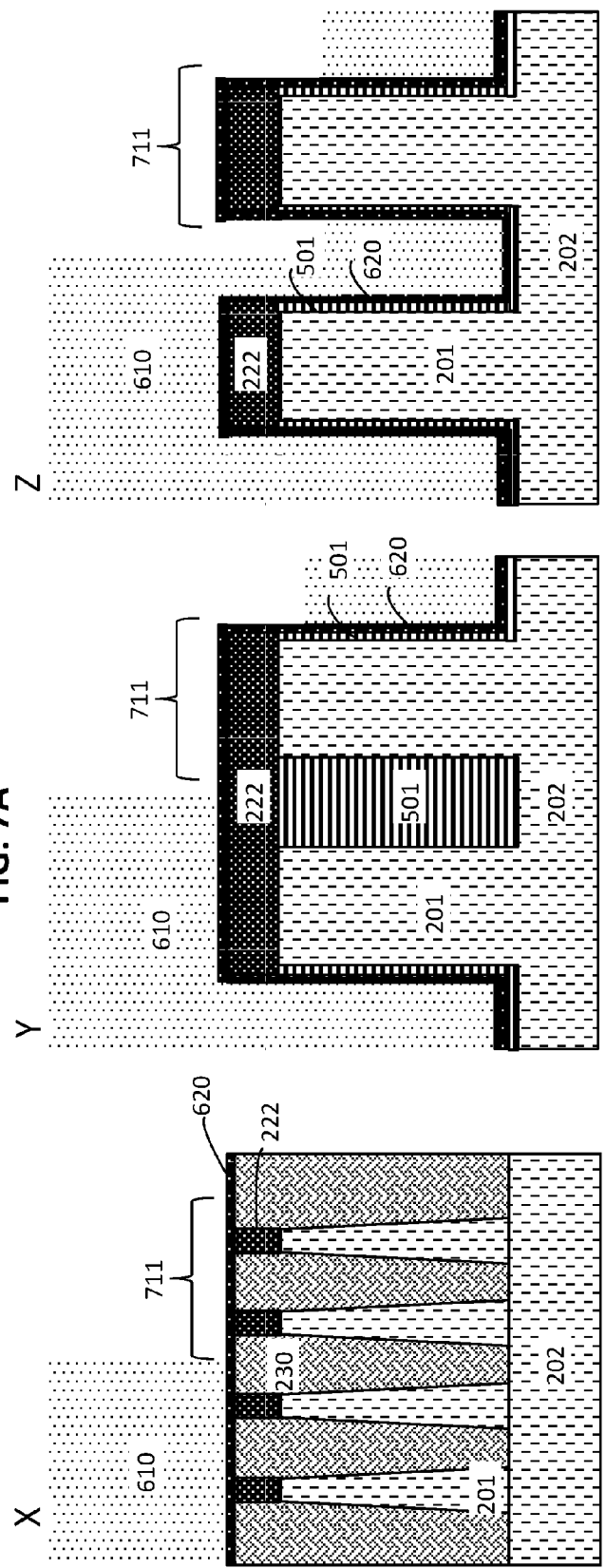
FIG. 7A
FIG. 7B
FIG. 7C
FIG. 7D

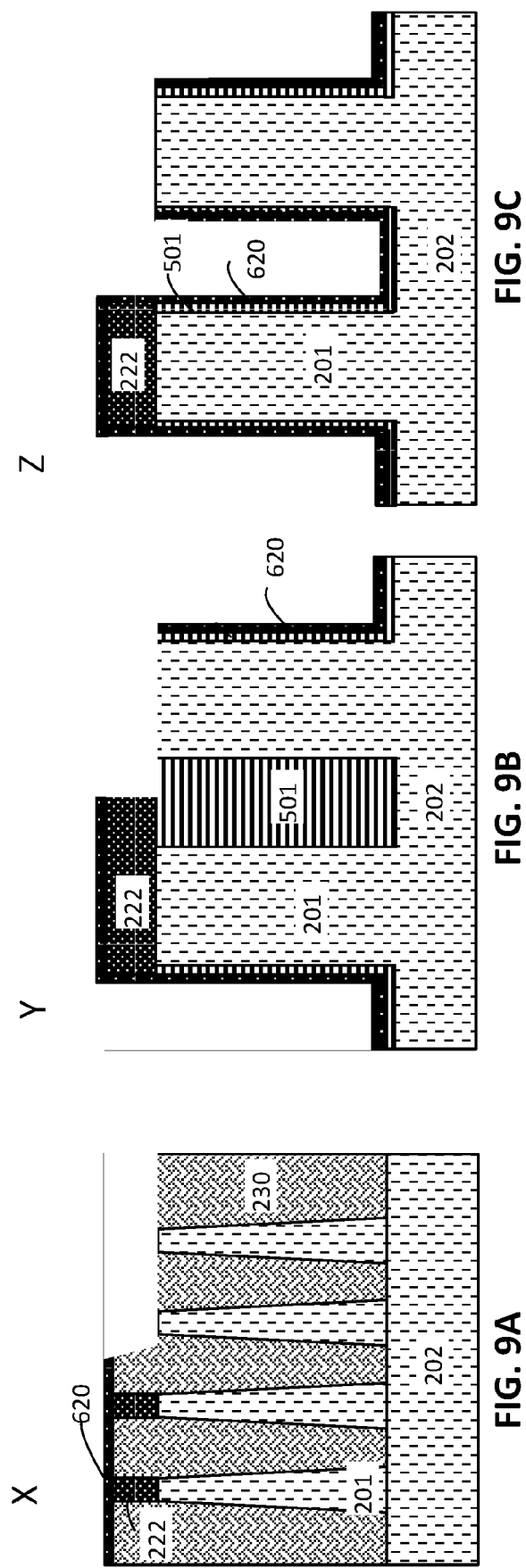

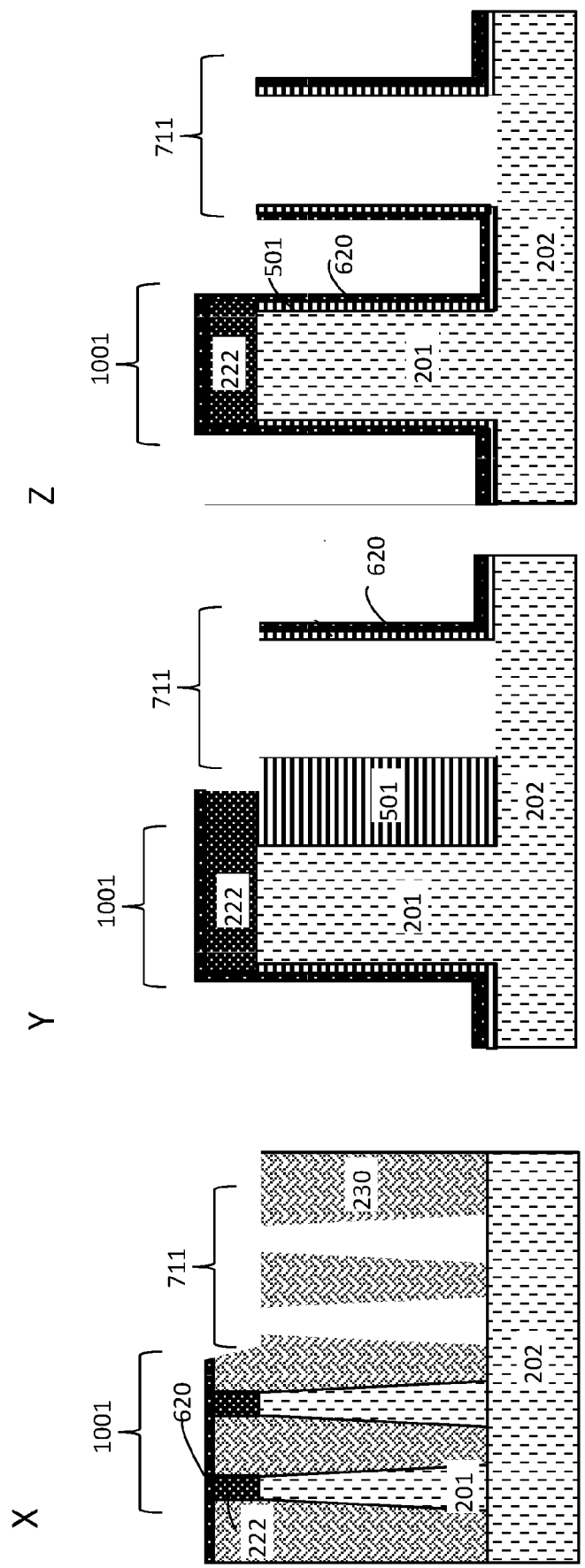

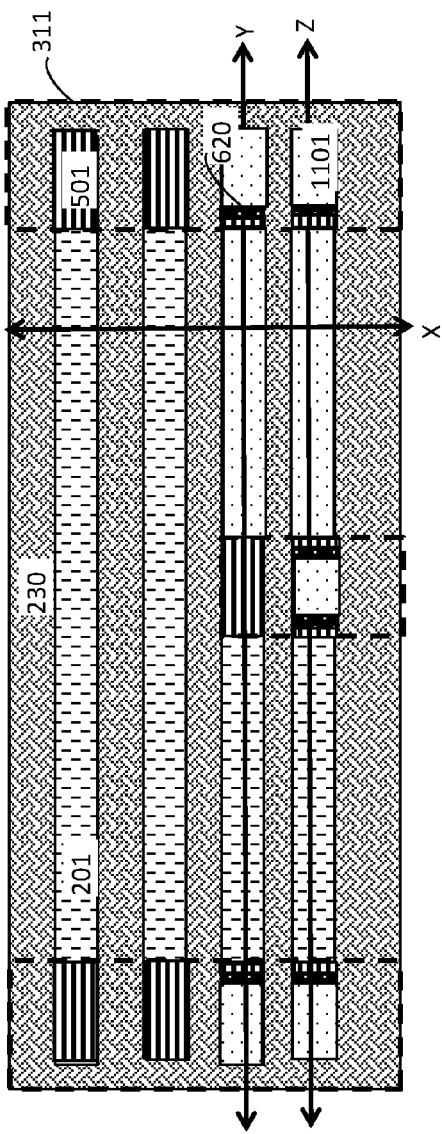
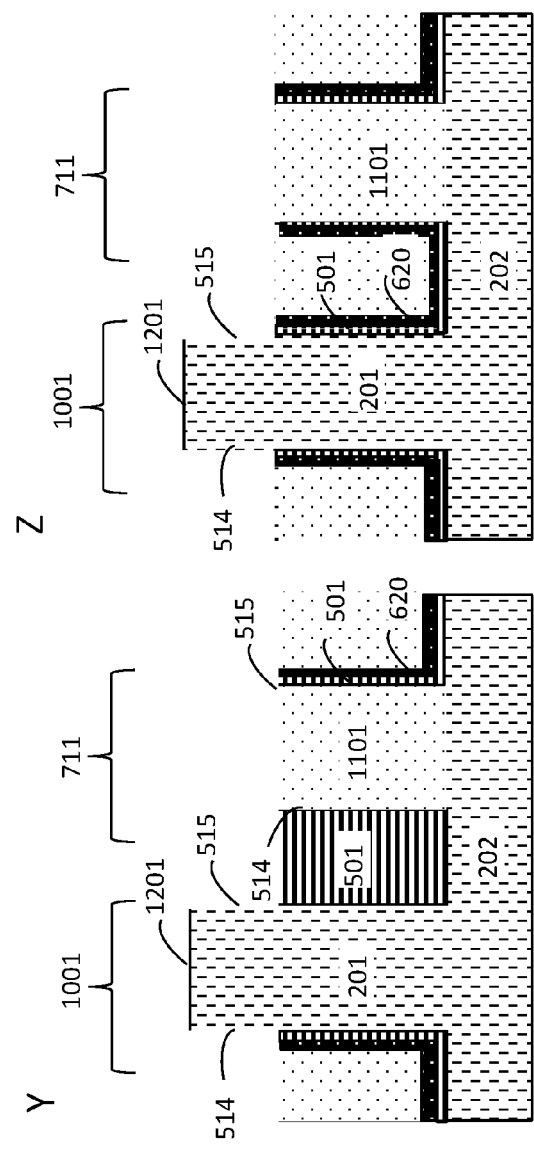
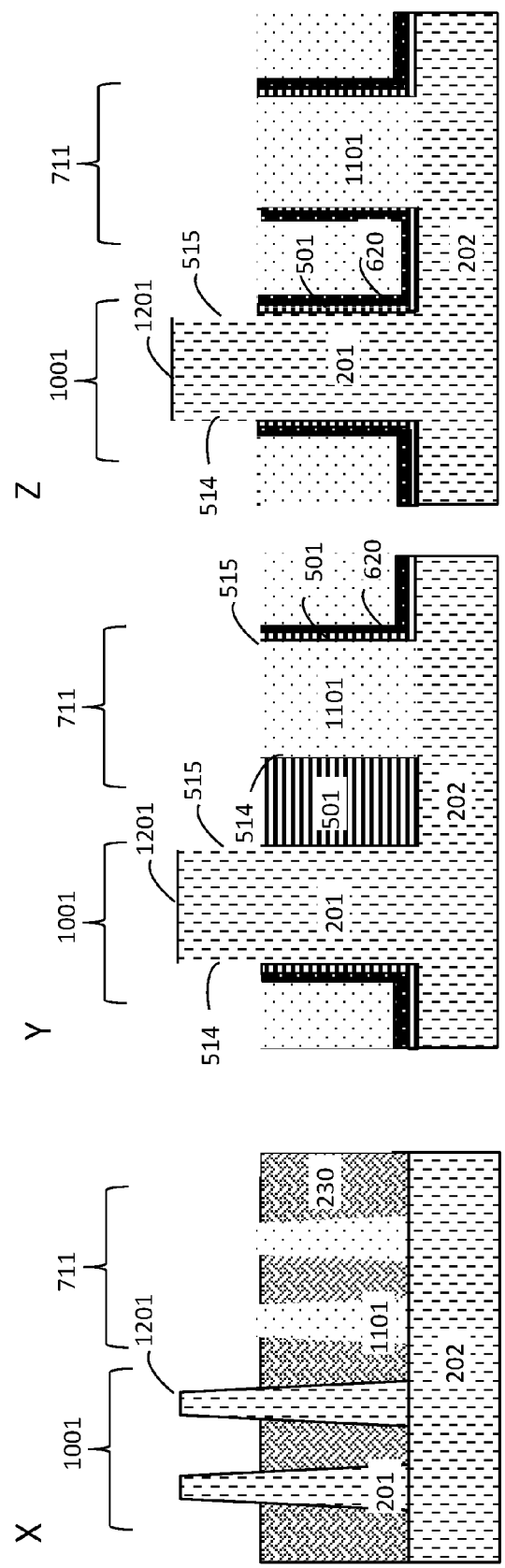
FIG. 12A
FIG. 12B
FIG. 12C
FIG. 12D

FIN CUT FOR TAPER DEVICE

PRIORITY

This application is a continuation of and claims priority from U.S. patent application Ser. No. 15/073,065, filed on Mar. 17, 2016, entitled "FIN CUT FOR TAPER DEVICE," which is a continuation of and claims priority from U.S. patent application Ser. No. 14/841,951, filed on Sep. 1, 2015, entitled "FIN CUT FOR TAPER DEVICE", each application is incorporated herein by reference.

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

According to an embodiment, a method of making a semiconductor device includes patterning a fin in a substrate; performing a first etching process to remove a portion of the fin to cut the fin into a first cut fin and a second cut fin, the first cut fin having a first fin end and a second fin end and the second cut fin having a first fin end and a second fin end; forming an oxide layer along an endwall of the first fin end and an endwall of the second fin end of the first cut fin, and an endwall of the first fin end and an endwall of the second fin end of the second cut fin; disposing a liner onto the oxide layer disposed onto the endwall of the first fin end of the first cut fin to form a bilayer liner; and performing a second etching process to remove a portion of the second cut fin.

According to another embodiment, a method of making a semiconductor device includes patterning a fin in a substrate; removing a portion of the fin to define a first exposed end and a second exposed end; oxidizing a portion of the first exposed end and the second exposed end to form an oxide layer; disposing a liner over a portion of the oxide layer; and performing a second etching process to remove a portion of the fin.

Yet, according to another embodiment, a semiconductor device includes a fin patterned in a substrate, the fin having a first distal end partially defining a first endwall and a second distal end partially defining a second endwall; a bilayer liner disposed onto the first endwall of the first distal end; and a monolayer liner disposed onto the second endwall of the second distal end.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-1F illustrate an exemplary conventional method of cutting fins, in which:

FIG. 1A is a top view of fins arranged in a fin array;

FIG. 1B is a top view after patterning a mask over the fins;

FIGS. 1C and 1D are cross-sectional side views through the X-axis and Y-axis, respectively, of FIG. 1B after performing an anisotropic fin cut;

FIGS. 1E and 1F are cross-sectional side views through the X-axis and Y-axis, respectively, of FIG. 1B after performing an isotropic fin cut;

FIGS. 2A-12D illustrate exemplary methods of making semiconductor devices according to embodiments of the present invention, in which:

FIG. 2A is a top view of fins with hard masks disposed over the fins;

FIGS. 2B and 2C are cross-sectional side views through the X-axis and Y-axis, respectively, of FIG. 2A;

FIG. 4A is a top view after cutting the fins and removing the mask;

FIGS. 4B and 4C are cross-sectional side views through the X-axis and Y-axis, respectively, of FIG. 4A;

FIG. 5A is a top view after oxidizing the end portions of the cut fins;

FIGS. 5B and 5C are cross-sectional side views through the X-axis and Y-axis, respectively, of FIG. 5A;

FIG. 7A is a top view after patterning and etching the planarization layer;

FIGS. 7B, 7C, and 7D are cross-sectional side views through the X-axis, Y-axis, and Z-axis, respectively, of FIG. 7A;

FIGS. 9A, 9B, and 9C are cross-sectional side views through the X-axis, Y-axis, and Z-axis, respectively, after removing the planarization layer;

FIGS. 10A, 10B, and 10C are cross-sectional side views through the X-axis, Y-axis, and Z-axis, respectively, after removing the fin material beneath the mask opening;

FIG. 12A is a top view after recessing the oxide to reveal the uncut fins; and

FIGS. 12B, 12C, and 12D are cross-sectional side views through the X-axis, Y-axis, and Z-axis, respectively, of FIG. 12A.

DETAILED DESCRIPTION

Figure 1A:
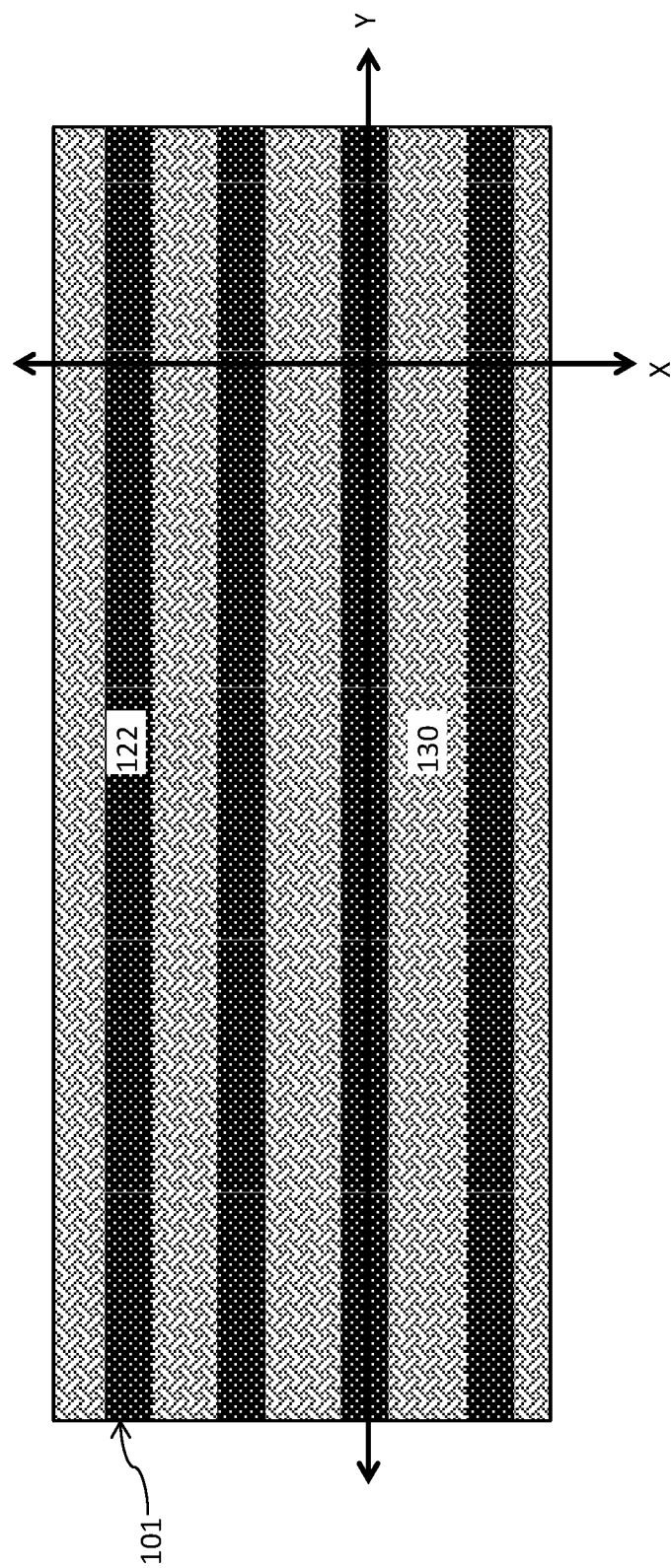

Conventional methods for cutting fins for FinFET devices may have drawbacks, including for example, mask overlay misalignment. FIGS. 1A-1F illustrate an exemplary conventional method of cutting fins 101. FIG. 1A is a top view of fins 101 arranged in a fin array. The fins 101 are patterned in a substrate 102, as shown in FIGS. 1C-1F, and surrounded by shallow trench isolation (STI) regions 130. A fin cap 122 comprising a hard mask material is formed over the fins 101.

Figure 1B:
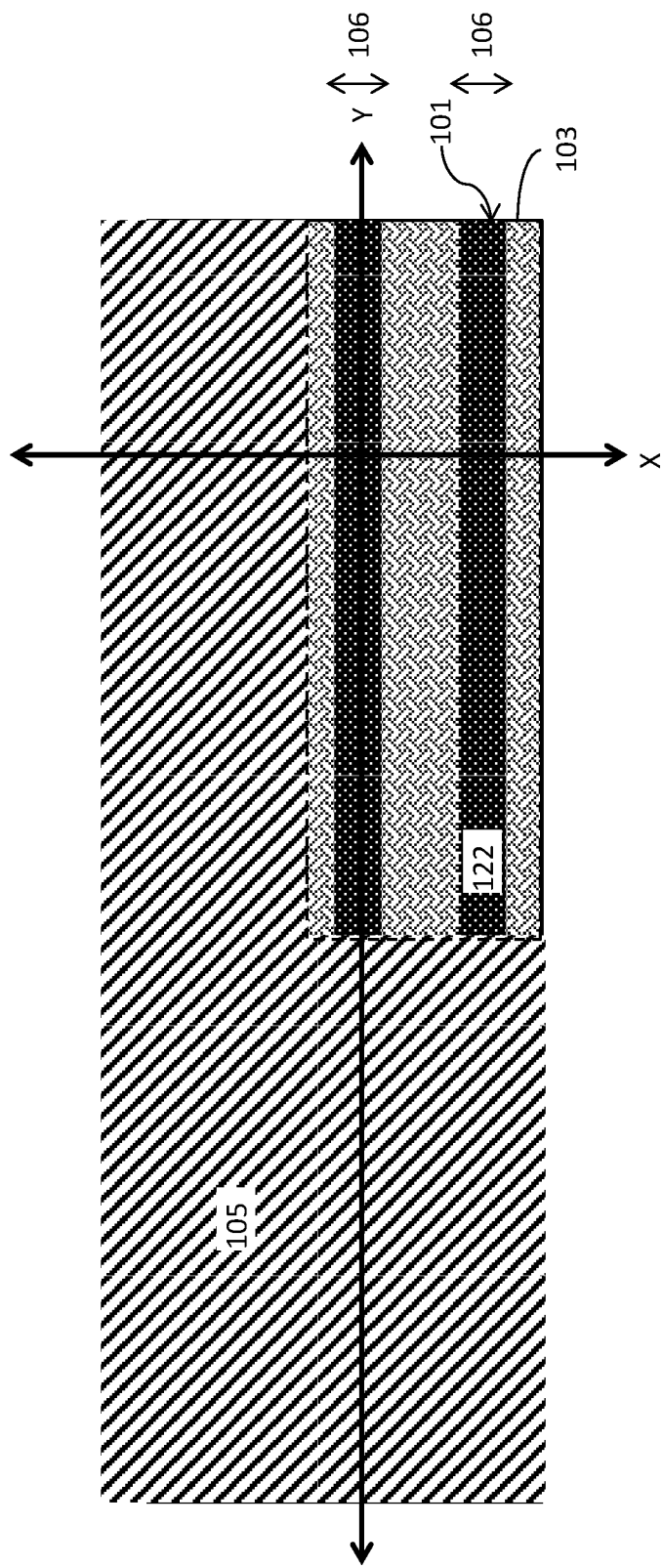

FIG. 1B is a top view after disposing a mask 105 over the fins 101. The mask 105 is patterned to form a mask pattern 103 (fin cut opening) and to expose a portion of the fins 101 beneath the mask 105. The mask pattern 103 represents an ideal mask overlay for cutting fins 101 because the entire width 106 of each fin is exposed beneath the mask pattern 103. In practical application, however, cutting the fins 101 using anisotropic and isotropic cutting methods presents challenges because the mask overlay may not be ideal. When the mask 105 is misaligned, the entire width 106 of each fin will not be exposed, which may result in partial fin cutting.

FIGS. 1C and 1D are cross-sectional side views through the X-axis and Y-axis, respectively, of FIG. 1B after performing an anisotropic fin cut. An anisotropic etching process, for example, reactive ion etching (RIE), ion beam etching, or laser ablation, may be employed to perform the anisotropic fin cut. Although the fin cut region 141 in the Y-axis direction (FIG. 1D) is clean and complete (substantially the entire fin 101 is removed), the fin cut region 141 in the X-axis direction (FIG. 1C) leaves residual fin material 142 or creates undesired fin damage due to mask pattern 103 misalignment and the etching angle.

Figure 1F:
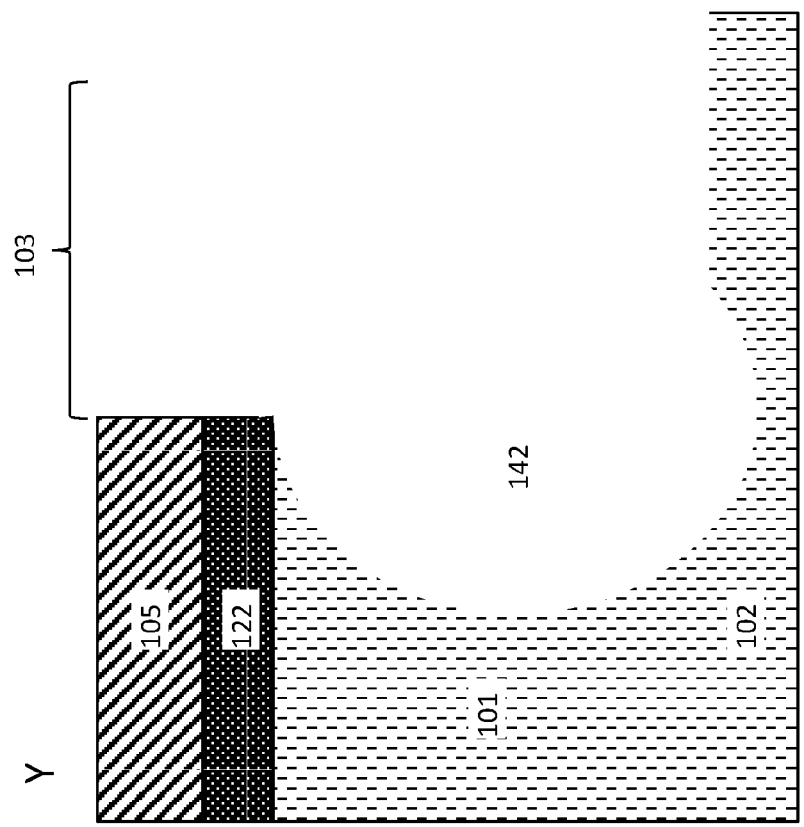
Figure 1E:
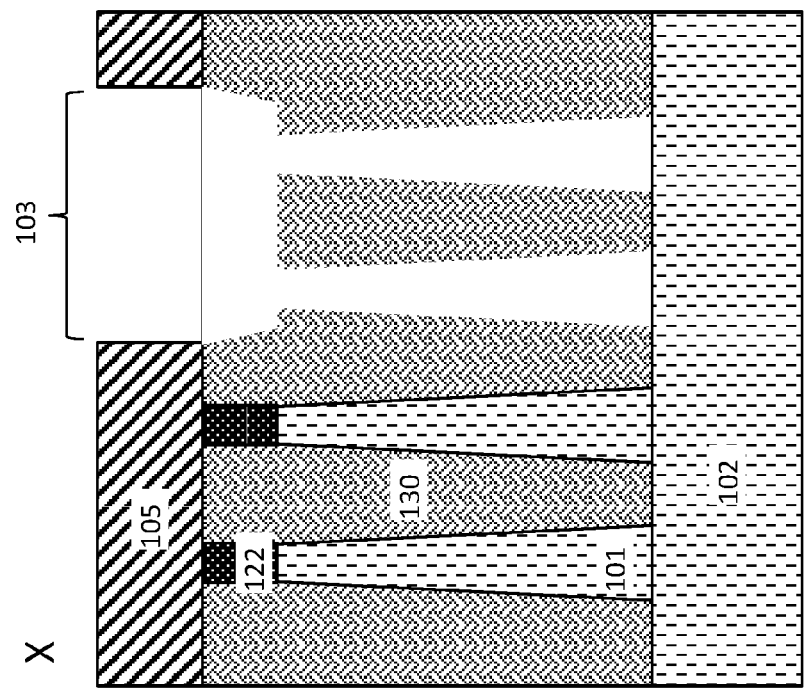

FIGS. 1E and 1F are cross-sectional side views through the X-axis and Y-axis, respectively, of FIG. 1B after performing an isotropic fin cut. An isotropic etching process, for example, a chemical process employing a chemical etchant may be employed to make the isotropic fin cut. Although the material forming the fins 101 beneath the mask pattern 103 is cleanly removed in the X-axis direction (FIG. 1E), unintended fin undercuts in the region 142 may occur.

Accordingly, various embodiments provide methods of cutting fins (or removing undesired fin portions) without jeopardizing the desired fin portions in devices with closely spaced fins. Thermal oxidation is used to seal fin ends in a two-step fin cutting method including anisotropic and isotropic etching processes. Thermal oxidation protects the fins to ensure substantially complete removal of undesired fin portions. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning again to the Figures, FIGS. 2A-12D illustrate exemplary methods of making semiconductor devices according to various embodiments. FIG. 2A is a top view of fins 201 with hard masks 222 disposed over the fins 201. FIGS. 2B and 2C are cross-sectional side views through the X-axis and Y-axis, respectively, of FIG. 2A.

The fins 201 are patterned in a substrate 202. Non-limiting examples of suitable substrate 202 materials include silicon, sapphire, germanium, gallium arsenide, silicon germanium, indium arsenide, indium phosphide, or any combination thereof. The fins 201 may be formed in the substrate 202 by depositing a hard mask 222 material over the substrate 202. The hard mask 222 material forms a fin cap. Non-limiting examples of suitable materials for the hard mask 222 (fin caps) include silicon dioxide, silicon nitride, or any combination thereof. In one embodiment, a mask is disposed over the hard mask 222 material and patterned and a reactive ion etching (RIE) process is employed to form one or more fins 201 in a fin array. The fins 201 may be arranged in substantially parallel rows as shown in FIG. 2A.

An oxide material is deposited around the fins 201 to form the STI regions 230. Non-limiting examples of suitable oxide materials for the STI regions 230 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

Figure 3A:
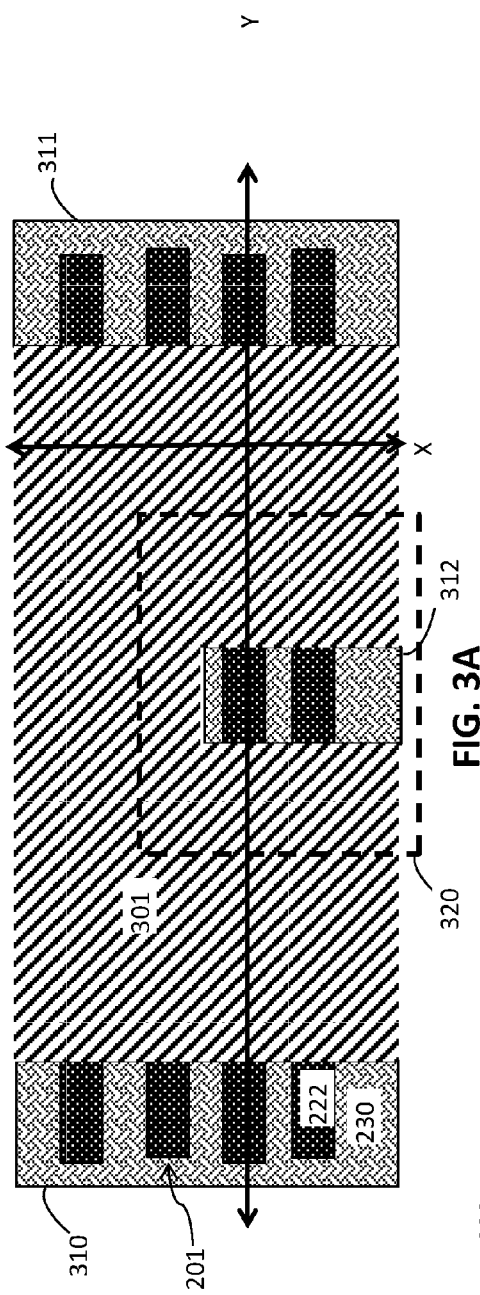
FIG. 3A is a top view of fin cut openings patterned in a mask disposed over the fins.

FIG. 3A is a top view of fin cut openings 310, 311, 312 patterned in a mask 301 disposed over the fins 201. The mask 301 may be, for example, a resist material (e.g., a photoresist material). The mask 301 is patterned by etching to remove the mask 301 material in a desired pattern. When the mask 301 is a photoresist, the mask 301 is patterned by exposing the mask 301 to a desired pattern of radiation. Then the exposed photoresist is developed with a resist developer to provide a patterned photoresist with fin cut openings 310, 311, 312. The fin cut openings 310, 311, 312 expose the fins 201 beneath that will be cut. The fin cut openings 310, 311 are used to cut the ends of the fins 201. The fin cut opening 312 are used to cut a single fin 201 into two shorter length fins. The fin cut openings 310, 311, 312 may be patterned in any desired position over the fins 201 and are not limited to the ends of the fins 201 or to the middle of the fins 201. As long as three openings are patterned to cut the fins 201 in three different locations along the length of the fins 201. Cutting the fins 201 through fin cut opening 312 will cut a single fin into two shorter fins. Cutting the fins 201 through fin cut openings 310, 311 will shorten fins 201 and reveal ends of the fins 201.

Figure 3C:
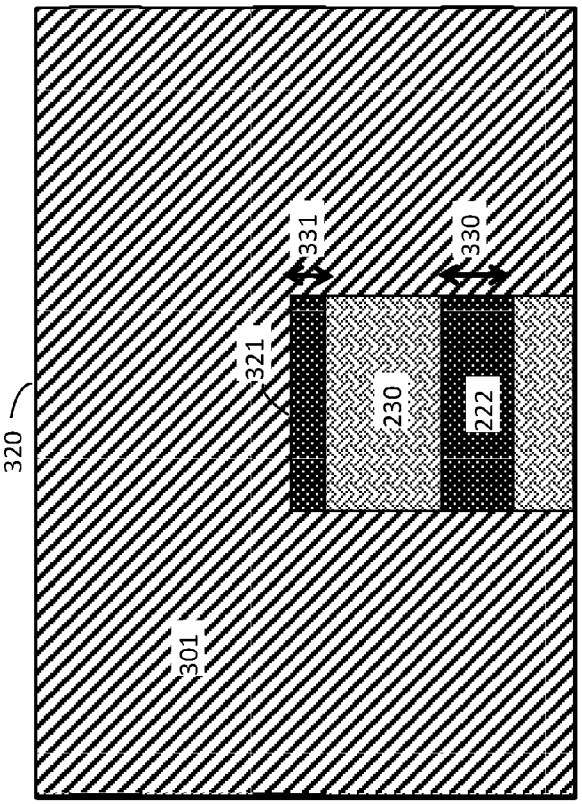
FIG. 3C is an expanded view of the fin cut opening of FIG. 3A with a poor mask overlay.
Figure 3B:
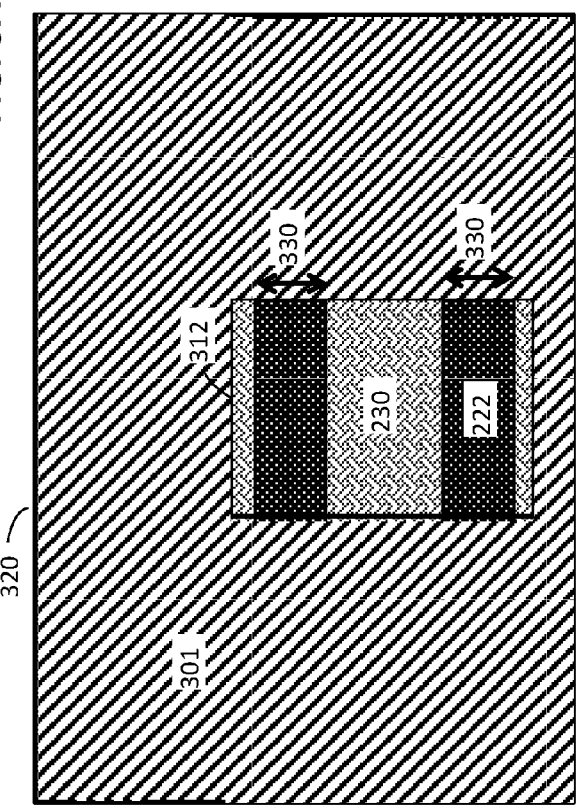
FIG. 3B is an expanded view of a fin cut opening of FIG. 3A with an ideal mask overlay.

FIG. 3B is an expanded view of FIG. 3A showing the region 320 around the fin cut opening 312 with an ideal or preferred mask 301 overlay. The fins 201 beneath the hard masks 222 are exposed across the entire width 330 to enable a clean fin cut.

FIG. 3C is an expanded view of FIG. 3A showing the region 320 around the fin cut opening 312 with a poor mask 301 overlay. One fin 201 beneath the hard mask 222 is partially exposed across the partial width 331 through fin cut opening 321. Another fin 201 is exposed across the entire width 330. The poor mask overlay will result in the fins 201 only being partially cut.

FIG. 4A is a top view after cutting the fins 201 through the fin cut openings 310, 311, 312 and removing the mask 301. FIG. 4A illustrates cutting the fins 201 through the poor mask 301 overlay of FIG. 3C. FIGS. 4B and 4C are cross-sectional side views through the X-axis and Y-axis, respectively, of FIG. 4A.

The fins 201 and hard mask 222 are removed in the region beneath the fin cut openings 310, 311, 312 by employing a dry etching process, for example, and anisotropic etching process (first etching process). The anisotropic etching process may be, for example, an RIE process. The fin 201 material is removed down to the level of about the substrate 202. With an ideal mask overlay as shown in FIG. 3B, two shorter fins 201 would be formed in the cross-sectional view through the Y-axis (FIG. 4C). However, the poor mask overlay (FIG. 3C) results imperfect fin cutting, as shown in FIG. 4C, where the fin 201 is only partially severed. The partial fin cut is also shown in FIG. 4A beneath the fin cut opening 312 where only a portion of the hard mask 222 and fin 201 material is removed in the region 413. In the region 414, the fins 201 are completely cut into two shorter fins.

FIG. 5A is a top view after oxidizing the end portions of the fins 201 to form an oxide layer 501. FIGS. 5B and 5C are cross-sectional side views through the X-axis and Y-axis, respectively, of FIG. 5A. An oxide layer 501 is formed along a sidewall (endwall) of the first ends 514 and second ends 515 of the cut fins 201. The surface of the material forming the fins 201 and substrate 202 oxidize after being cut and exposed to air. In one embodiment, the fins 201 and substrate 202 are formed from silicon and the oxide layer 501 includes silicon dioxide. The oxide layer 501 forms beneath the hard mask 222 and along sidewalls (endwalls) between the fins 201, as shown in FIG. 5C.

The oxide layer 501 forms by employing a thermal oxidation process. Thermal oxidation is performed at a temperature in a range from about 300 to about 1100° C., which provides a High Temperature Oxide layer (HTO). Water vapor (e.g., steam) or molecular oxygen may be used as the oxidant. The oxidizing ambient also may include hydrochloric acid (HCl).

The thickness of the oxide layer 501 along any sidewall (or endwall) (first send 514 or second end 515) may generally vary and is not intended to be limited. In one embodiment, the thickness of the oxide layer 501 is in a range from about 3 to about 10 nanometers (nm). In another embodiment, the thickness of the oxide layer 501 is in a range from about 4 to about 6 nm. In other embodiments, the fin 201 material is oxidized to form an oxide layer 501 that is at least half the fin width 530, or critical dimension (CD).

In some embodiments, the thickness of the oxide layer 501 in the region 502 between the fins 201 (along one sidewall/endwall of the fins 201) is thicker than the oxide layer 501 along another sidewall of the fins 201. In other embodiments, the thickness of the oxide layer 501 along a sidewall of the first end 514 is different than the thickness of the oxide layer 501 along a sidewall of the second end 515. The thickness of the oxide layer 514 along a sidewall of the first end 514 may be thicker or thinner than the thickness of the oxide layer 501 along a sidewall of the second end 515. In one embodiment, the oxide layer 501 forms an asymmetric liner with varying thicknesses of the oxide layer along different sidewalls (first end 514 and second end 515) of the fins 201.

Figure 6A:
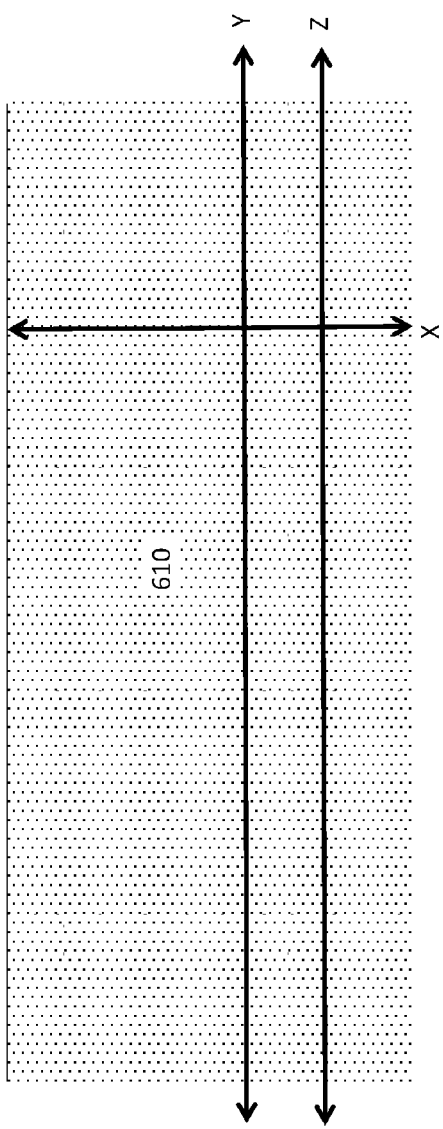
FIG. 6A is a top view after disposing a liner and a planarization layer over the fins.
Figure 6D:
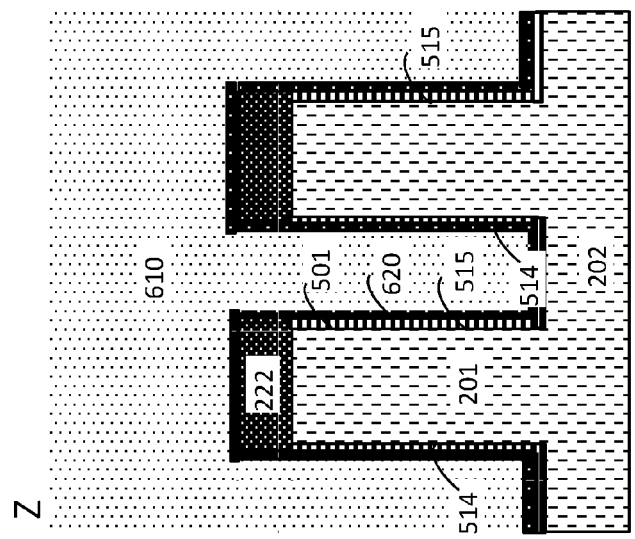
FIGS. 6B, 6C, and 6D are cross-sectional side views through the X-axis, Y-axis, and Z-axis, respectively, of FIG. 6A.
Figure 6C:
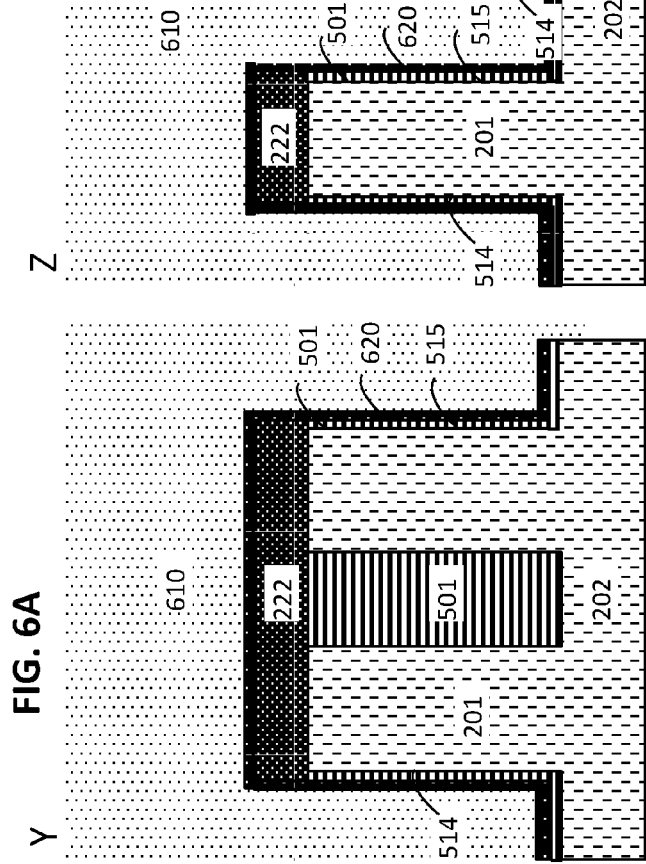
Figure 6B:
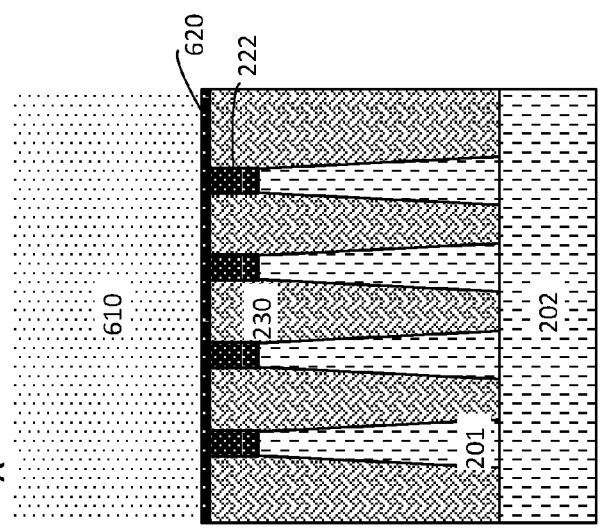

FIG. 6A is a top view after disposing a liner 620 and a planarization layer 610 over the fins 201. FIGS. 6B, 6C, and 6D are cross-sectional side views through the X-axis, Y-axis, and Z-axis, respectively, of FIG. 6A. The Y-axis view in FIG. 6C shows the partially cut fins 201 in region 413 (see FIG. 4A). The Z-axis view in FIG. 6D shows the completely cut fins 201 in region 414 (see FIG. 4A).

The liner 620 is deposited as a blanket layer over the exposed fin hard masks 222 and over the oxide layer 501. As shown in FIG. 6C, the liner 620 is only deposited along a single sidewall of the partially cut fins (first end 514 and second end 515) (see region 413 in FIG. 4A). The oxide layer 501 and the liner 620 form a bilayer liner along a sidewall of the first end 514. The oxide layer 501 forms a monolayer liner along a sidewall of the second end 515.

In FIG. 6D, when the fins 201 are completely cut through fin cut opening 312 (see FIG. 4A), a bilayer liner including the oxide layer 501 and the liner 620 are formed along sidewalls of the first and second ends 514, 515.

The liner 620 includes an insulating hard mask material. Non-limiting examples of suitable materials for the liner 620 include silicon nitride, SiOCN, SiBCN, or any combination thereof. The thickness of the liner 620 may generally vary and is not intended to be limited. In one embodiment, the thickness of the liner 620 is in a range from about 1 to about 10 nm. In another embodiment, the thickness of the liner 620 is in a range from about 2 to about 5 nm. The liner 620 material is formed using a suitable deposition process, for example, chemical vapor deposition (CVD) or physical vapor deposition (PVD).

The planarization layer 610 may be, for example, an OPL coating or other suitable spin-on coating. The planarization layer 610 may include an organic material, for example, a polymeric material.

FIG. 7A is a top view after patterning the planarization layer 610 to form a fin cut pattern 710 (second fin cut pattern). FIGS. 7B, 7C, and 7D are cross-sectional side views through the X-axis, Y-axis, and Z-axis, respectively, of FIG. 7A. The fin cut pattern 710 exposes the liner 620. The fin cut pattern 710 exposes the liner 620 over the fins 711 to be removed.

The planarization layer 610 is patterned by disposing an etch mask (not shown) over the planarization layer 610. The etch mask (not shown) may be a resist material, for example, a photoresist material. The planarization layer 610 is patterned by removing the planarization layer 610 material by, for example, a dry etching process (e.g., an RIE process or a plasma ashing process). The liner 620 over the fins 201 is exposed.

Figure 8C:
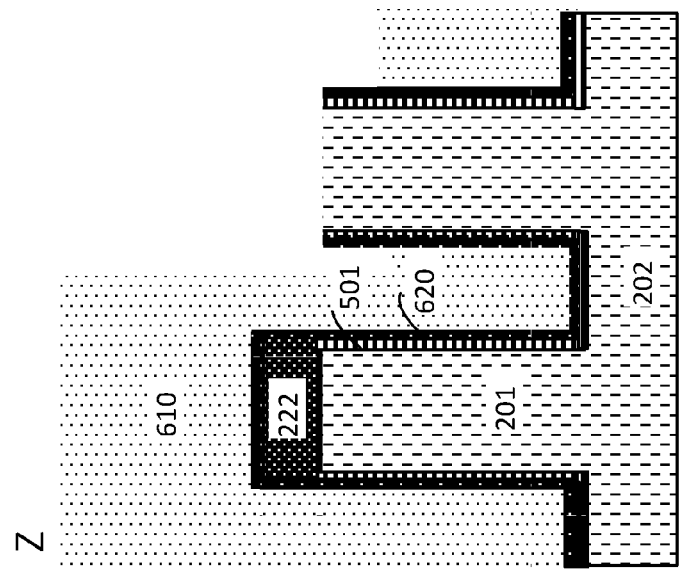
FIGS. 8A, 8B, and 8C are cross-sectional side views through the X-axis, Y-axis, and Z-axis, respectively, after removing the liner and hard masks over the fins beneath the mask opening.
Figure 8B:
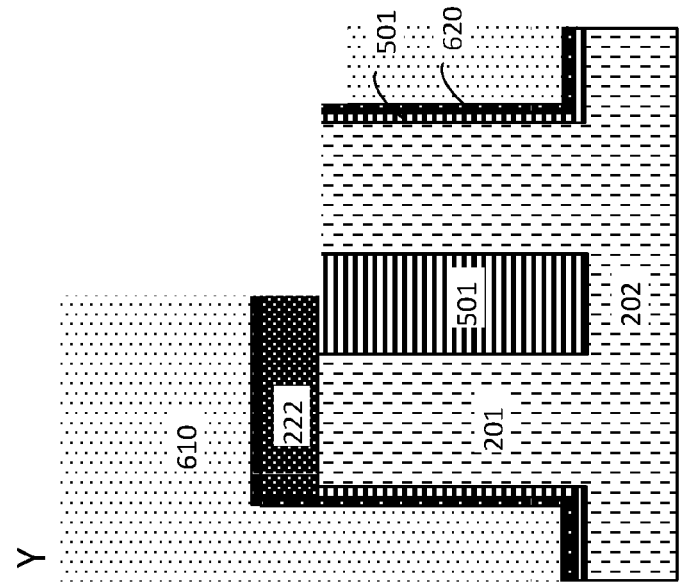
Figure 8A:
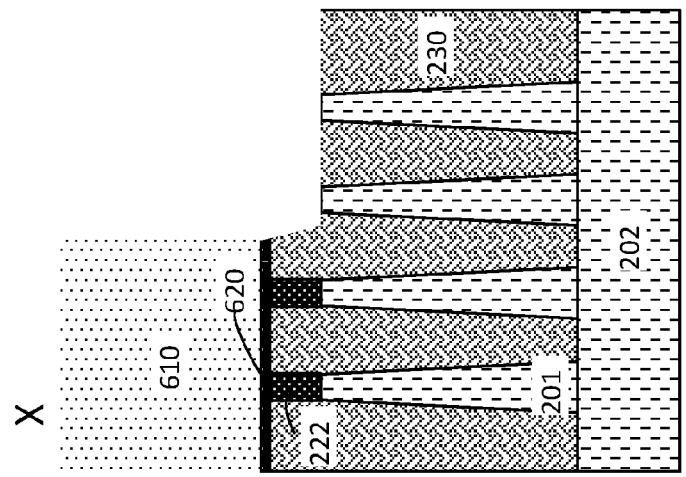

FIGS. 8A, 8B, and 8C are cross-sectional side views through the X-axis, Y-axis, and Z-axis, respectively, after removing the liner 620 and hard mask 622 over the fins 201. The liner 620 and hard mask 622 are removing by employing an etching process. The etching process may be, for example, a dry etching process (plasma etching or reactive ion etching (RIE).

FIGS. 9A, 9B, and 9C are cross-sectional side views through the X-axis, Y-axis, and Z-axis, respectively, after removing the planarization layer 610. The planarization layer 610 is removed. The planarization layer 610 is removed, by, for example, a plasma ashing process.

FIGS. 10A, 10B, and 10C are cross-sectional side views through the X-axis, Y-axis, and Z-axis, respectively, after removing the fin 201 material from the exposed fins 201 (fins 711). The fins 711 (unwanted fins) are removed by employing an isotropic etching process (a second etching process). Isotropic etching removes the fin 201 material via a chemical process using an etchant substance. Non-limiting examples of isotropic etchants include hydrofluoric acid, hydrofluoric nitric acid, phosphoric acid, or any combination thereof. Other non-limiting examples of suitable isotropic dry etching processes include FRONTIER silicon etching isotropic processes (Applied Materials, Santa Clara, Calif.). The fin 201 material is selectively removed. The oxide layer 510 around the fins 1001 (desired fin material not to be removed) acts as an etch stop to protect the fins 1001.

Figure 11C:
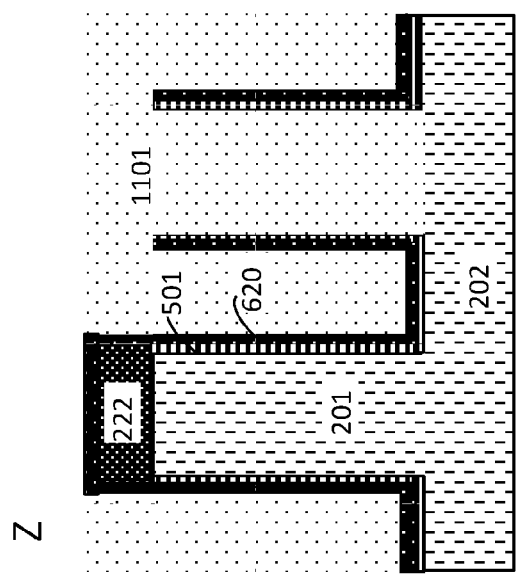
FIGS. 11A, 11B, and 11C are cross-sectional side views through the X-axis, Y-axis, and Z-axis, respectively, after filling the open fin regions with an oxide.
Figure 11B:
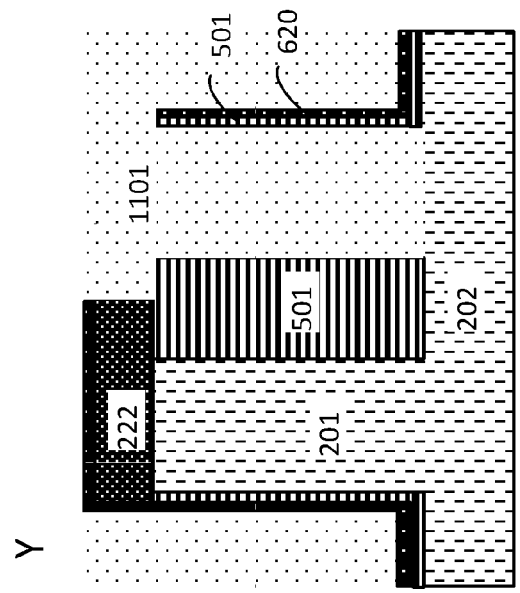
Figure 11A:
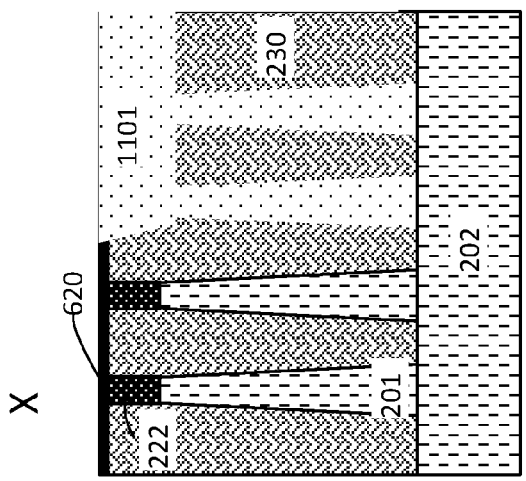

FIGS. 11A, 11B, and 11C are cross-sectional side views through the X-axis, Y-axis, and Z-axis, respectively, after removing filling the removed fin regions with oxide 1101 to form STI regions. The oxide 1101 may be the same or different than the material forming the STI regions 230. Non-limiting examples of oxides include silicon dioxide, tetraethylorthosilicate (TEOS) oxide, high aspect ratio plasma (HARP) oxide, silicon oxide, high temperature oxide (HTO), high density plasma (HDP) oxide, oxides (e.g., silicon oxides) formed by an atomic layer deposition (ALD) process, or any combination thereof. A planarization process, for example, chemical mechanical planarization (CMP), is performed to polish the surface of the oxide 1101.

FIG. 12A is a top view after etching the oxide 1101 to reveal the uncut fins 201. FIGS. 12B, 12C, and 12D are cross-sectional side views through the X-axis, Y-axis, and Z-axis, respectively, of FIG. 12A. The liner 620 and hard mask 222 over the fins 1001 are removed. The oxide 1101 and STI regions 230 are recessed to reveal the uncut fin tips 1201. The oxide 1101 and STI regions 230 are etched (recessed) by an amount in a range from about 20 to about 50 nm. The oxide 1101 and STI regions 230 may be etched by a process using dilute hydrofluoric acid (DHF) or by an etching process employing simultaneous exposure $H_2$, $NF_3$, and $NH_3$ plasma by-products (SiCoNi etching).

The oxide layer 501 is recessed by performing an etching process. The oxide layer 501 may be recessed, by, for example, a process using buffered hydrofluoric acid (BHF) or DHF. The liner 620 may be recessed by performing an etching process, for example, a process including hot phosphoric acid. The oxide layer 501 and the liner 620 are recessed to about the level of the recessed oxide 1101.

As shown in FIG. 12C, some fins 201 include an asymmetric liner (see also, FIG. 6C). The fin 201 includes a bilayer liner along one sidewall of the first end 514 and a monolayer liner along a sidewall of the second end 515.

As shown in FIG. 12D, other fins 201 include a symmetric liner (see also, FIG. 6D). The fin 201 includes a bilayer liner along sidewalls of the first end 514 and the second end 515.

As described above, various embodiments provide methods of cutting fins (or removing undesired fin portions) without jeopardizing the desired fin portions in devices with closely spaced fins. Thermal oxidation is used to seal fin ends in a two-step fin cutting method including anisotropic and isotropic etching processes. Thermal oxidation protects the fins to ensure substantially complete removal of undesired fin portions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
   patterning a fin in a substrate;
   performing a reactive ion etch process to remove a portion of the fin and to cut the fin into a first cut fin and a second cut fin, the first cut fin having a first fin end and a second fin end, and the second cut fin having a first fin end and a second fin end;
   performing a thermal a thermal oxidation process to form an oxide layer on an endwall of the first fin end and an endwall of the second fin end of the first cut fin, and an endwall of the first fin end and an endwall of the second fin end of the second cut fin, a thickness of the oxide layer on the endwall of the first fin end of the first cut fin being different than a thickness of the oxide layer on the endwall of the first fin end of the second cut fin;
   disposing a liner comprising an insulating material onto the oxide layer disposed on the endwall of the first fin end of the first cut fin to form a bilayer liner comprising the liner and the oxide layer, the liner not being disposed on the second fin end of the first cut fin; and
   performing an isotropic etch process comprising a chemical etchant to remove a portion of the second cut fin, the oxide layer protecting the first cut fin from being etched during the isotropic etch process.

\* \* \* \* \*